(12) United States Patent
Lu et al.

(10) Patent No.: US 8,115,288 B2
(45) Date of Patent: Feb. 14, 2012

(54) LEAD FRAME FOR SEMICONDUCTOR DEVICE

(75) Inventors: Yongsheng Lu, Tianjin (CN); Bin Tian, Tianjin (CN); Nan Xu, Tianjin (CN); Jinzhong Yao, Tianjin (CN); Shufeng Zhao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/021,716

(22) Filed: Feb. 5, 2011

(65) Prior Publication Data
US 2011/0248393 A1    Oct. 13, 2011

(30) Foreign Application Priority Data

Apr. 9, 2010    (CN) .......................... 2010 1 0147513

(51) Int. Cl.
*H01L 21/60* (2006.01)
*H01L 23/495* (2006.01)

(52) U.S. Cl. ....................................................... 257/676

(58) Field of Classification Search .................. 257/693, 257/684, 784, 666–677, E23.031–E23.059, 257/E23.004, E23.005–E23.009, 100, 433, 257/434, 787–796, E31.117–E31.118, E51.02, 257/E23.116–E23.14, E21.502–E21.504, 257/E21.506–E21.519, 685, 686, 723, 726, 257/E25.031–E25.32; 438/15, 25, 26, 51, 438/55, 64–67, 112, 124, 126, 127, 123, 438/6, 28, 107, 109, 406, 455–459
See application file for complete search history.

(56) References Cited

U.S. PATENT DOCUMENTS

| | | | |
|---|---|---|---|
| 5,157,475 A | 10/1992 | Yamaguchi | |
| 5,157,480 A | 10/1992 | McShane | |
| 6,483,180 B1 | 11/2002 | Bayan | |
| 7,375,416 B2 | 5/2008 | Retuta | |
| 2003/0001244 A1* | 1/2003 | Araki et al. | 257/666 |
| 2006/0273433 A1* | 12/2006 | Itou et al. | 257/666 |
| 2007/0052070 A1* | 3/2007 | Islam et al. | 257/666 |
| 2007/0170555 A1* | 7/2007 | Camacho et al. | 257/666 |
| 2008/0067639 A1* | 3/2008 | Do et al. | 257/666 |
| 2008/0067640 A1* | 3/2008 | Do et al. | 257/666 |
| 2008/0122048 A1* | 5/2008 | Chan et al. | 257/666 |
| 2008/0185698 A1* | 8/2008 | Tseng et al. | 257/676 |
| 2008/0230881 A1* | 9/2008 | Camacho et al. | 257/666 |
| 2008/0251898 A1* | 10/2008 | Itou et al. | 257/666 |
| 2008/0283980 A1* | 11/2008 | Gao et al. | 257/670 |
| 2009/0127720 A1* | 5/2009 | Do et al. | 257/784 |

* cited by examiner

*Primary Examiner* — Dao H Nguyen
*Assistant Examiner* — Tram H Nguyen
(74) *Attorney, Agent, or Firm* — Charles Bergere

(57) ABSTRACT

A lead frame for reducing detrimental effects of burr formation includes a lead frame that has leads where a portion of a top surface is removed from a first lead and a portion of a bottom surface is removed from a second lead adjacent to the first lead to reduce spacing between leads while reducing the detrimental effects of burr formation, such as shorting and the like, caused during singulation of a semiconductor device manufactured with the lead frame.

8 Claims, 5 Drawing Sheets

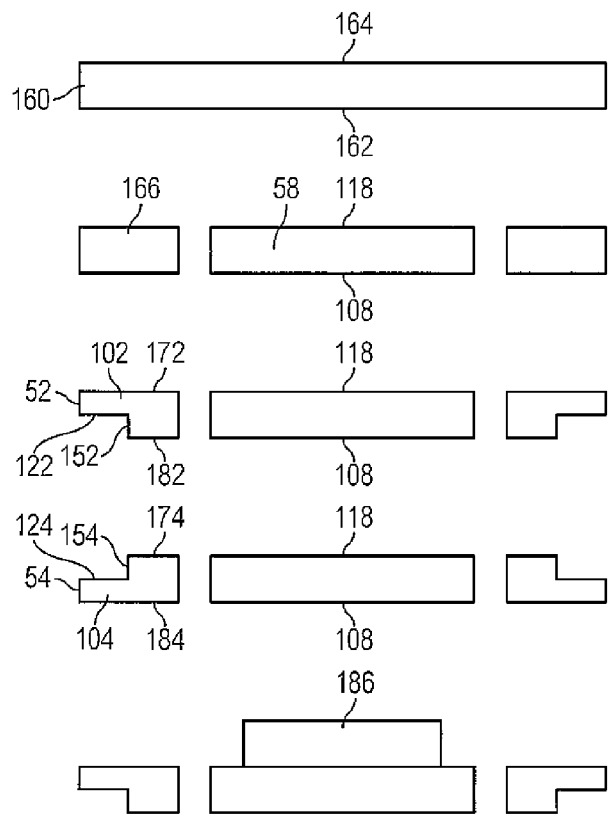
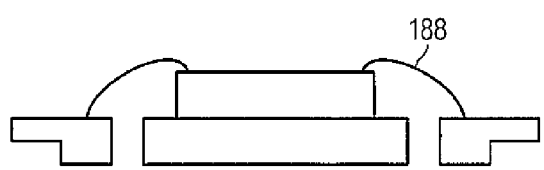
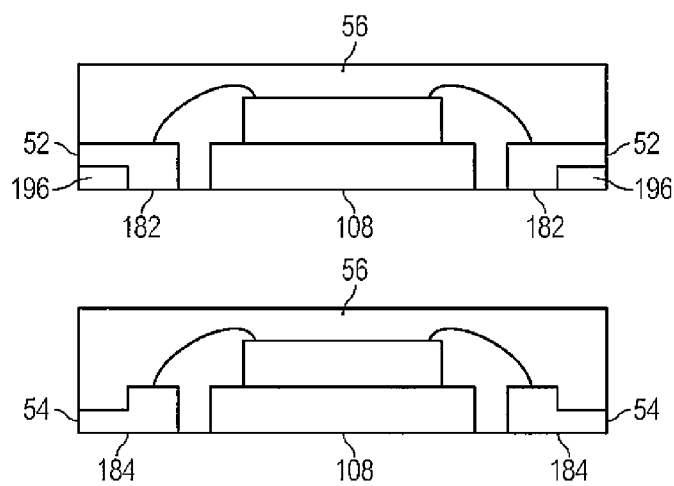
FIG. 4A
FIG. 4B
FIG. 4C
FIG. 4D
FIG. 4E
FIG. 4F
FIG. 4G
FIG. 4H

LEAD FRAME FOR SEMICONDUCTOR DEVICE

BACKGROUND OF THE INVENTION

The present invention relates generally to semiconductor packaging, and more particularly to a lead frame for packaging semiconductor devices that reduces the detrimental effects of burr formation during the singulation process.

Conventional semiconductor package devices 10, such as single row lead frame design quad flat no-lead (QFN) packages as shown in FIGS. 1A-1B, typically are assembled using matrix array packaging (MAP). MAP type semiconductor package devices are processed and manufactured as multiple semiconductor package devices on a single substrate bar unit. During assembly, the single substrate bar unit is divided into individual and discrete semiconductor package devices by a singulation process.

Each semiconductor package device 10 typically includes a lead frame with leads 12 and die bond area 14. A semiconductor integrated circuit (IC) die (not shown in FIGS. 1A-1B) is fixed or bonded to the die bond area 14 of the lead frame with adhesive such as an epoxy material. The lead frame is the central supporting structure of the semiconductor package device. After the IC die has been attached to the die bond area 14, the IC die is electrically connected to the leads 12 with wires by a wire bonding process to enable electrical interconnection between the IC die and an underlying substrate such as a printed circuit board (PCB). A mold compound 16 of ceramic or plastic material then encapsulates or partially encapsulates the die, wires, and part of the lead frame to protect them from the environment. Singulation is then performed on the encapsulated assemblies of the MAP to separate and complete the process of making discrete semiconductor package devices 10.

Conventionally, there are two types of singulation processes, saw singulation and punch singulation. During the singulation process of MAP devices, the semiconductor package device may become damaged as shown with a device 20 in FIG. 1B. For example, in saw singulation, formation of burrs 22, caused by the saw 24 smearing the leads 12 in the saw path direction 26, can cause one lead to extend to an adjacent lead. The burr 22 can lead to device failure as the smeared material may cause shorting between adjacent leads. Burr formation is becoming a greater concern in the industry as the number or density of input/outputs (IO) is increasing and the pitch or distance 28 between adjacent leads is becoming smaller. That is, there is a growing risk of burr formation and shorting.

Accordingly, there is a need to address or at least alleviate the above problems associated with conventional semiconductor package devices to reduce the detrimental effects of burr formation during singulation.

BRIEF DESCRIPTION OF THE DRAWINGS

In order that embodiments of the invention may be fully and more clearly understood by way of non-limitative examples, the following description is taken in conjunction with the accompanying drawings in which like reference numerals designate similar or corresponding elements, regions and portions, and in which:

FIGS. 4A-H illustrate cross-sectional views of a lead frame and semiconductor package device during assembly, in accordance with an embodiment of the invention.

DETAILED DESCRIPTION OF THE INVENTION

Figure 1A:
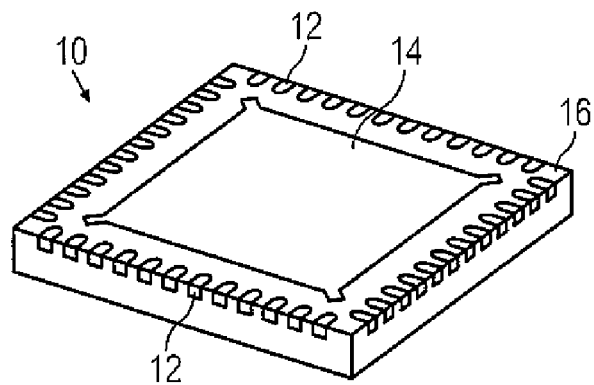
FIGS. 1A-B illustrate a bottom perspective view (FIG. 1A) and cross-sectional side view (FIG. 1B) of a conventional single row lead frame quad flat no lead (QFN) semiconductor package device during saw singulation.

An aspect of the invention is a lead frame for supporting a semiconductor die within a semiconductor package device, the lead frame comprising a die bond area for receiving a semiconductor die; and a plurality of leads arranged around and spaced apart from the die bond area for being electrically interconnected with the semiconductor die and for providing electrical interconnection for the semiconductor package device, the leads having a top surface and a bottom surface, wherein a first lead in the plurality of leads has a recessed portion from the top surface, and a second lead adjacent to the first lead has a recessed portion from the bottom surface for reducing burr formation effects.

In an embodiment the plurality of leads are arranged in a single row around the perimeter of the die bond area. The plurality of leads may comprise a plurality of first leads with the recessed portion from the top surface that form a first row, and a plurality of second leads with a recessed portion from the bottom surface that form a second row. The first lead and the second lead are adjacent and are separated by a first distance, and the first lead and a third lead adjacent to the second lead are separated by a second distance, wherein the second distance extends beyond a zone of potential burr formation from the first lead. The first distance may be decreased.

In an embodiment the depths of the recessed portions of the first lead and the second lead may differ or be the same. The depth of the recessed portion of the first lead may be half the thickness or more of the lead frame.

An aspect of the invention is a semiconductor package device comprising a semiconductor die; a lead frame for supporting the semiconductor die; and a semiconductor package body at least partially encapsulating the semiconductor die; the lead frame comprising: a die bond area for receiving the semiconductor die; and a plurality of leads arranged around and spaced apart from the die bond area for being electrically interconnected with the semiconductor die and for providing electrical interconnection for the semiconductor package device, the leads having a top surface and a bottom surface, wherein a first lead in the plurality of leads has a recessed portion from the top surface, and a second lead adjacent to the first lead has a recessed portion from the bottom surface for reducing burr formation effects wherein a surface of the recessed portions of the first and second leads are exposed on a surface of the semiconductor package body; and the semiconductor die having a first surface and a second surface, the first surface attached on the die bond area of the lead frame and the second surface electrically interconnected with at least one lead of the plurality of leads.

In an embodiment, the plurality of leads of the lead frame is arranged in a single row around the perimeter of the die bond area. The plurality of leads of the lead frame may comprise a plurality of first leads with a recessed portion from the top surface that form a first row exposed on a surface of the semiconductor package body, and a plurality of second leads with a recessed portion from the bottom surface that form a second row exposed on a surface of the semiconductor package body. The first lead and the adjacent lead of the lead frame may be separated by a first distance, and the first lead and a third lead adjacent to the second lead are separated by a second distance, wherein the second distance extends beyond a zone of potential burr formation from the first lead.

An aspect of the invention is a method of forming a lead frame for a semiconductor package, the method comprises providing a lead frame having a die bond area for receiving a semiconductor die and a plurality of leads arranged around and spaced apart from the die bond area for being electrically interconnected with the semiconductor die and for providing electrical interconnection for the semiconductor package device, the leads having a top surface and a bottom surface; removing a portion from the top surface to form a recessed portion of a first lead in the plurality of leads; and removing a portion from the bottom surface to form a recessed portion of a second lead adjacent to the first lead for reducing burr formation effects.

Figure 2A:
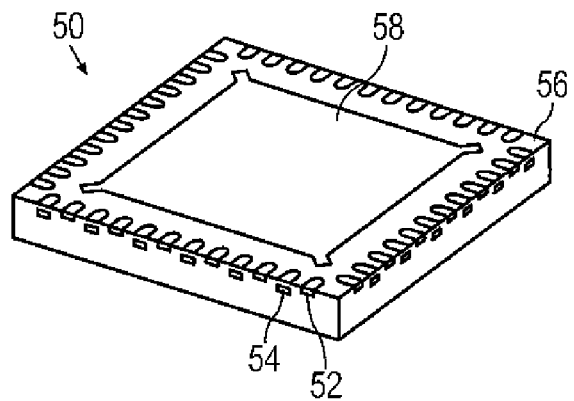
FIGS. 2A-B illustrate a bottom perspective view (FIG. 2A) and cross-sectional side view (FIG. 2B) of a single row lead frame quad flat no lead (QFN) semiconductor package device during saw singulation in accordance with an embodiment of the invention.

Referring now to FIG. 2A, a bottom perspective view of a semiconductor package device 50 in accordance with an embodiment of the invention is illustrated. The semiconductor package device shown is a single row lead frame quad flat no-lead (QFN) design having matrix array packaging (MAP). It will be appreciated that embodiments of the invention may apply to any lead frame based semiconductor package device having MAP. The device 50 comprises a lead frame having leads 52, 54 and die bond area 58 that are encapsulated or partially encapsulated by molding material 56. The device 50 comprises an integrated circuit (IC) die that is attached to the top surface of the die bond area of the lead frame. The IC die is wire bonded with electrical interconnectors, such as wires or the like. The molding material 56 also encapsulates the IC die and the interconnectors which are not shown in FIG. 2A. The molding material 56 forms the body of the semiconductor package device. The IC die and interconnectors are shown in FIG. 4A-H and FIG. 5 in describing the process of making the package device.

Figure 2B:
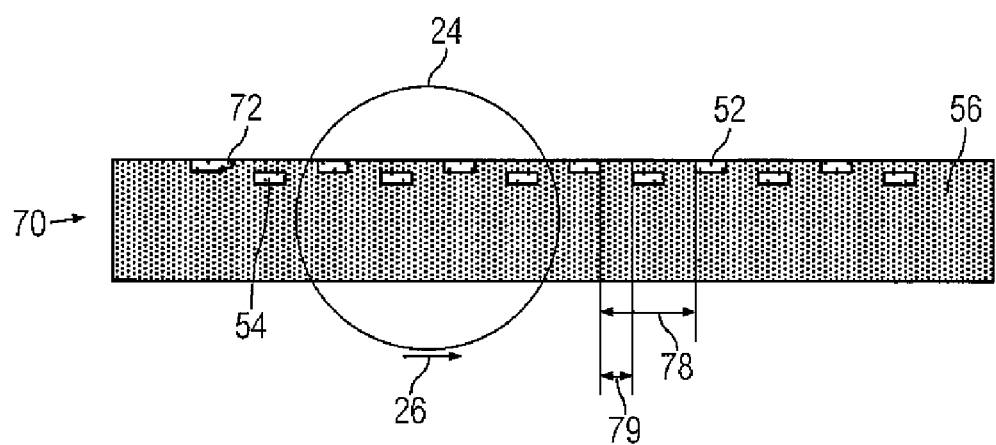

FIG. 2B shows cross-sectional side view 70 of device 50 during the singulation process of the MAP devices. The singulation process is the process of separating an encapsulated die assembly from an array of physically connected encapsulated die assemblies sharing a common lead frame. FIG. 2B shows a burr formation 72 created during saw singulation. The burr formation is caused by the friction between the saw 24 and the lead material. The burr formation 72 extends in the direction 26 of the path of the saw from the lead surface 52 into the encapsulating molding material 56. The burr formation zone only extends in the direction of the path of the saw. Typically, the saw is a circular saw and the saw rotates. The burr formation zone extends primarily along the translational path direction of the saw. The material may pulled slightly in the circular or rotational direction of the saw. Therefore, in conventional designs, adjacent exposed lead surfaces that are within the burr formation zone are at risk. However, in embodiments of the invention, the adjacent exposed lead surfaces are arranged such that the adjacent exposed lead surfaces are outside the burr formation zone.

The material of the lead frame and leads may be a base material layer of copper (Cu) that is coated, alloyed or pre- plated with a metal layer or layers such as gold (AU), nickel (Ni), palladium (PD), tin (Sn) or the like. After the base plate of the lead frame is etched or processed, the etched base plate is then plated or coated with coating layers. The metal layers can often contribute to the smearing or burr formation if the ductibility of the metal is large. For example, burr formations are greater in Cu based lead frames pre-plated with Sn when compared with purely Cu based lead frames because the ductability of Sn is larger than Cu. Lead frames that are used in QFN, power QFN, and the like, have such plating or coating layers. In burr formations, the burr is mainly the plating material.

The pitch 78 of the leads is the distance between adjacent leads. The exposed lead surfaces 52, 54 are formed from a single row lead frame. The leads are partially encapsulated such that adjacent leads each have an exposed surface that reduces the detrimental effects of burr formation by increasing the distance between leads. Therefore, in embodiments of the invention when burr formations are formed during singulation, the distance between adjacent exposed surfaces of adjacent leads are greater than the distances that burr formations extend from the exposed leads thereby reducing the detrimental effects of burr formation.

Figure 1B:
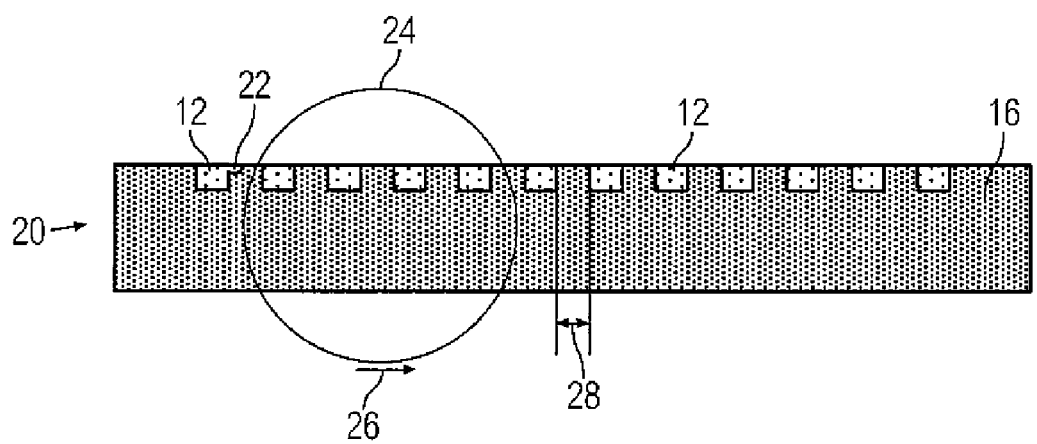

The pattern of the exposed surfaces of the leads 52, 54 in an embodiment is shown in FIG. 2B as each adjacent lead surface being staggered with respect to the adjacent lead surface. In this embodiment the staggered exposed leads 52, 54 on the surface of the package body form two rows. It will be appreciated that the exposed surfaces of the leads 52, 54 can form different configurations and patterns. For example, a specific selected lead may be partially etched on the top and the bottom surface to the same or different depths. This would allow the resulting exposed surface of the leads to form different number of rows, configurations, and the like, so long as the exposed surface of the lead along the side of the surface of the semiconductor package device are outside the burr formation zone. In the embodiment shown in FIG. 2B the exposed portion or surface of the lead on the surface of the package body in the same row have a pitch 78 that is greater than the burr formation zone. In comparing the pitch 28 of adjacent leads in the conventional device shown in FIG. 1B with the pitch 78 of the adjacent leads in the same exposed row in the embodiment of the invention shown in FIG. 2B, the pitch 78 is greater in the embodiment shown in FIG. 2B. For example, the pitch 78 between exposed surfaces of leads in the same exposed row may be 1.8 mm. The leads of the lead frame are arranged and processed to reduce the exposed surfaces of the leads 52, 54 that acts to reduce the detrimental effects of burr formations. As the adjacent lead in the staggered exposed row is not within the burr formation zone, the spacing or pitch 79 between adjacent leads in different exposed rows can be reduced. For example, the pitch 28 of the conventional device may be 0.9 mm, the pitch 79 between exposed leads in different rows may be less than 0.9 mm. The pitch 79 between adjacent leads exposed on the surface of the package body is the spacing between the actual single row of leads of the lead frame. In comparing the pitch 28 of adjacent leads in the conventional device shown in FIG. 1B with the pitch 79 of the adjacent leads in different rows in the embodiment of the invention shown in FIG. 2B, the pitch 79 is less in the embodiment shown in FIG. 2B. The leads of the lead frame are arranged and processed to lessen or decrease the pitch 79 of the adjacent leads in different rows to allow for highly or more densely packed lead surface configuration. Thus, the space or pitch 79 between each lead in the single row of leads arranged around the die pad area can be reduced. With this configuration, the single row of leads are densely packed and the detrimental effects of burr formations is reduced since adjacent leads have recessed portions that are arranged such that upon encapsulation the exposed surfaces of the recessed portions of the leads on the surface of the semiconductor package body are out of the burr formation zone. The number of leads can be increased as the spacing or pitch 79 between leads can be reduced. There may be an array of such encapsulated die assemblies having a MAP configuration that undergo a singulation process to separate and complete the process of making the semiconductor package devices 10.

Figure 3A:
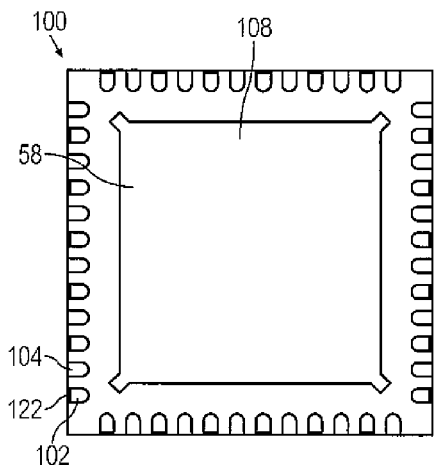
FIGS. 3A-C illustrate a bottom plan view (FIG. 3A), top plan view (FIG. 3B) and bottom perspective view (FIG. 3C) of a lead frame after etching selected portions of the lead frame in accordance with an embodiment of the invention.
Figure 3B:
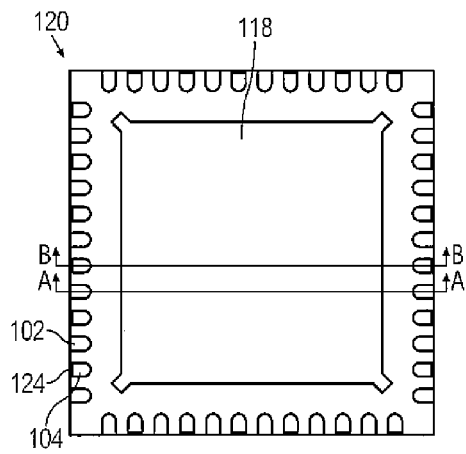

FIG. 3A shows a bottom plan view 100 of a lead frame after partial etching the selected bottom surfaces of selected leads 102 and bottom surface of leads 104 that are not etched. Leads 102, 104 are adjacent leads of the single row of leads each having a portion removed from a top and/or bottom surfaces, respectively, to form the recessed portions of the leads and to form the two or more rows, or the like, or exposed leads along the surface of the semiconductor package device upon encapsulation and singulation. The bottom surface 108 of the die bond area 58 is shown. FIG. 3B shows a top plan view 120 of a lead frame after partial etching the selected top surfaces of selected leads 104. The top surface 118 of the die bond area 58 is shown. The bottom surfaces of the selected leads 102 are partially etched to a predetermined depth. The bottom surface of the leads 102 have etched bottom portion surface 122. The top surfaces of the selected leads 104 are partially etched to a predetermined depth. The top surface of the leads 104 have etched top portion surface 124.

Figure 5:
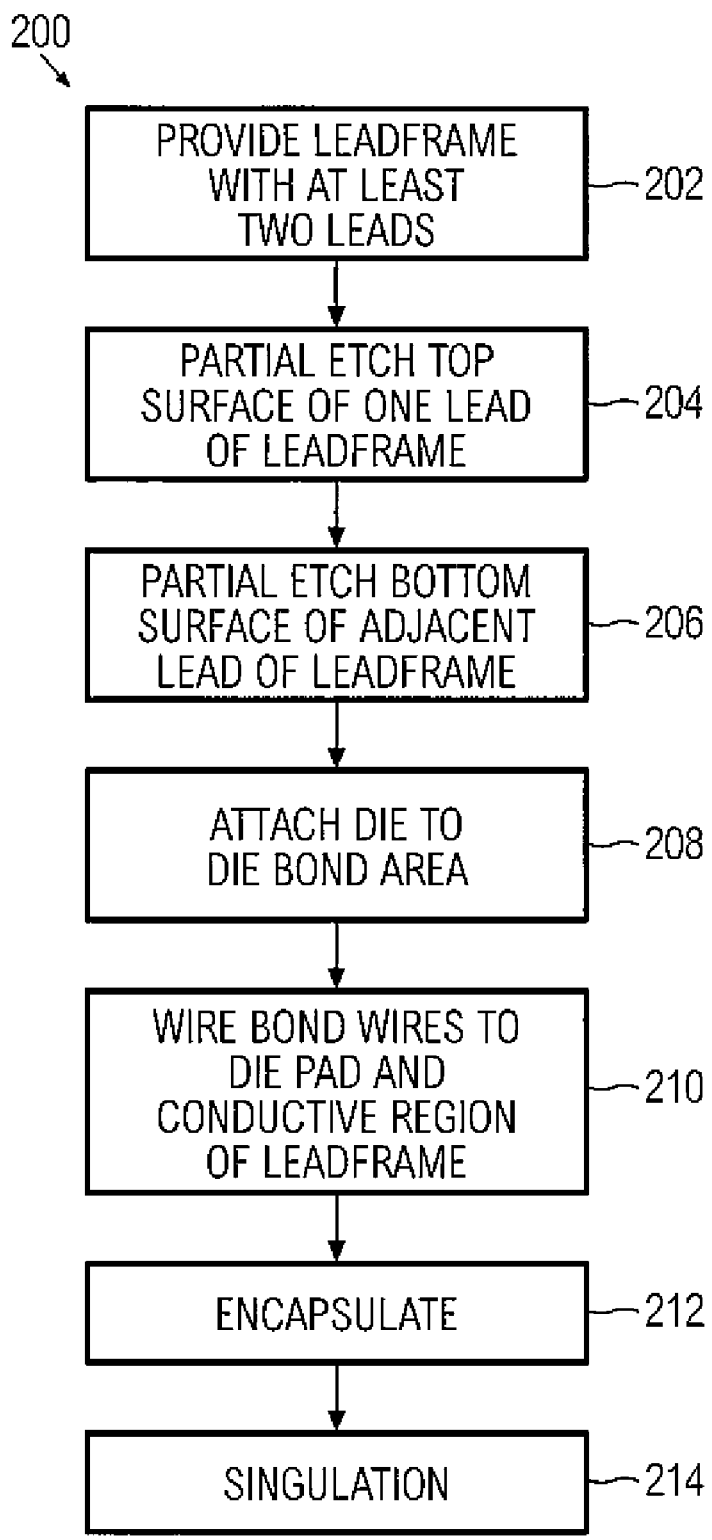
FIG. 5 is a flow chart of a method assembling a semiconductor device in accordance with an embodiment of the invention.

The depth the selected leads 102, 104 are etched may be any depth to reduce the detrimental effects of burr formations and also continue to serve as leads on the package device. After the material is removed, the portion of each lead in the single row of leads arranged around the die bond area is recessed, forming a recessed portion. A surface of the recessed portion of each lead is exposed after singulation on a surface of the semiconductor package body. In forming the recessed portions, the leads are not entirely or completely etched through. The leads are only partially etched or half-etched. The depth etched on leads 102 from the bottom surface may differ or be the same from the depth etched on leads 104 from the top surface. In the embodiment shown in FIG. 3C the leads 102, 104 are half-etched. In this embodiment where both sets of leads 102, 104 are half-etched, the etching may be performed simultaneously, however, partial etching may be completed at different processing times, as shown in FIG. 5. The depth is chosen to prevent or reduce the detrimental effects of burr formation on adjacent exposed leads on the package body. The depth can be any depth as long as the lead frame stability is maintained during package assembly.

Figure 3C:
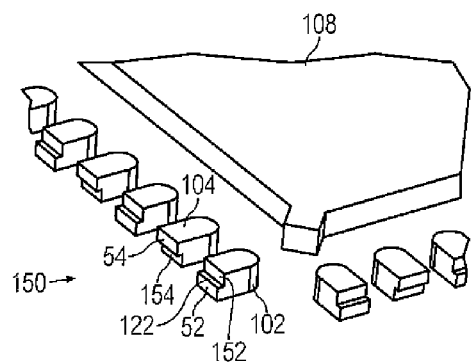

The resulting leads after partially etching are shown in the bottom perspective view 150 of the lead frame in FIG. 3C. The etched side surface portion 152 and non-etched or undisturbed portion side surface portion 52 of the leads 102 partially etched on the bottom surface, and the etched side surface portion 154 and non-etched or undisturbed side surface portion 154 of the leads 104 partially etched on the top surface are shown. It will be appreciated that in embodiments a selected lead may have portions of the top and bottom surfaces removed or partially etched to form a recessed portion on the top surface of the lead and a recessed portion on the bottom surface of the lead.

FIG. 4A-H illustrates cross-sectional views of processing a lead frame and semiconductor package device in accordance with an embodiment of the invention. FIG. 4A shows a lead frame base plate 160 with bottom surface 162 and top surface 164. The lead frame base plate 160 undergoes etching to form the leads 166 and die bond area 58 shown in FIG. 4B. The die bond area has die bond area bottom surface 108 and die bond area top surface 128. The lead frame base plate 160 may be processed by different techniques, such as etching and the like, to form the leads 166. For example a mask (not shown) may be applied to the bottom surface 162 and top surface 164 of the lead frame base plate 160 outlining the lead frame layout to etch the uncovered areas.

FIG. 4C-D show the lead configuration discussed above and shown in FIG. 3A-C in greater detail. FIG. 4C shows the leads 102 partially etched from the bottom surface and FIG. 4D shows the leads 104 partially etched from the top surface. FIG. 4C is a cross-sectional view of the partially etched lead frame of FIG. 3A taken along line A-A. FIG. 4D is a cross-sectional view of the partially etched lead frame of FIG. 3B taken along line B-B.

In FIG. 4C the cut-out portion or recessed portion is partially removed or etched away is defined by bottom etched portion surface 122 and side etched portion surface 152 of lead 102 with bottom surface partially etched. The undisturbed top surface 172 of bottom surface of lead 102 with bottom surface partially etched is shown.

In FIG. 4D the cut-out portion or recessed portion is partially removed or etched away is defined by top etched portion surface 124 and side etched portion surface 154 of lead 104 with top surface partially etched. The undisturbed top portion surface 174 of bottom surface of lead 104 with top surface partially etched is shown. FIG. 4C also shows the undisturbed bottom portion surface 162 of lead 102 with bottom surface partially etched. FIG. 4D also shows the undisturbed bottom surface 184 of bottom surface of lead 104 with top surface partially etched.

It will be appreciated that different techniques may be used to remove the material of the lead frame to form the desired lead configuration. For example a photolighographic based etch process may be used, or other techniques, chemistries and/or processes used to etch, grind or otherwise form the cut-out lead configuration, and can be widely varied in accordance with embodiments of the invention. It will be appreciated that the etching process may be conducted simultaneously or in a stepwise manner.

FIG. 4E shows IC die 186 attached to the top surface 118 of the die pad area 58. The die may be attached with an adhesive material such as an epoxy material, solder material, non-solder material or the like. The semiconductor die that is attached to the die bond area of the lead frame may be any suitable semiconductor device such as horizontal semiconductor devices, vertical semiconductor devices, or the like. The die may have the entire or portion of the bottom surface of the die attached to the die bond area. The process of attaching the semiconductor die to lead frames can be widely varied in accordance with embodiments of the invention. After attaching the die 186 to the recessed die bond area, the lead frame die assembly is wire bonded with interconnects 188 as shown in FIG. 4F. The interconnects 188 may be wires such as gold wires and the like. The process of wire bonding can be widely varied in accordance with embodiments of the invention.

As shown in FIG. 4G-H the lead frame die assembly is encapsulated with an encapsulating material 56 such as an epoxy or other plastic material, ceramic material, or the like. The cut-out areas or recessed portions defined by bottom etched portion surface 122 and side etched portion surface 152 of lead 102 with bottom surface etched are filled with molding compound 196. The undisturbed or unetched portion of the bottom surface 182 of the lead 102 with partially etched bottom surface is exposed and not encapsulated by molding material 56 as shown in FIG. 4G. Also side surface 52 of lead 102 is also exposed and not encapsulated by molding material 56. Similarly, side surface 54 and undisturbed or unetched bottom surface 184 of lead 104 with partially etched top surface are exposed and not encapsulated by molding material 56 as shown in FIG. 4H. The exposed side surface 54 and bottom surface 184 of lead 104 form a continuous surface of lead material that is exposed and forms an angle of the semiconductor package device.

The process or method as described above in detail is shown in the flow chart 200 of FIG. 5 in accordance with an embodiment of the invention. At step 202, the lead frame base plate is provided with leads and die bond area defined. At step 204, selected leads are partially etched on the top surface to form recessed portions and at step 206, selected leads are partially etched on the bottom surface to form recessed portions. It will be appreciated that etching of the leads may be performed simultaneously in a single etching processing step or in separate etching processing steps. After partially etching the leads, at step 208, a die 180 is attached as shown in FIG. 4E to the top surface 128 of the die bond area 58. At step 210, the die is then wire bonded with interconnects such as wires 185 and at step 212 encapsulated with molding compound material 56. The encapsulated device is singulated at step 214 by saw or punch singulation.

Embodiments of the invention reduce the detrimental effects of burr formation that occur at the time of singulation. The lead frame is designed with leads that are processed and arranged with the portions or sections of leads exposed on the package body that are subject to burr formation to be arranged outside the zone of potential burr formation. Since the distance between adjacent leads is increased through etching selected portions or sections of selected leads, short risk and other detrimental effects of burr formations is reduced. Additionally, in embodiments the actual spacing or pitch between the leads having the top surface etched and leads having the bottom surface etched can be reduced thereby reducing the overall space required for the leads and allowing for the leads to be more tightly packed. Embodiments of the invention may be applied to all types of lead frame based semiconductor package devices such as MAP type devices, high input/output (IO) (x)QFN devices, power QFN devices, and the like.

While embodiments of the invention have been described and illustrated, it will be understood by those skilled in the technology concerned that many variations or modifications in details of design or construction may be made without departing from the present invention.

The invention claimed is:

1. A lead frame for supporting a semiconductor die within a semiconductor package device, the lead frame comprising:
   a die bond area for receiving a semiconductor die; and
   a plurality of leads arranged around and spaced apart from the die bond area for being electrically interconnected with the semiconductor die and for providing electrical interconnection for the semiconductor package device, the leads having a top surface and a bottom surface, wherein a first lead in the plurality of leads has a recessed portion from the top surface, and a second lead adjacent to the first lead has a recessed portion from the bottom surface for reducing burr formation effects;
   wherein the first lead and the second lead are adjacent and are separated by a first distance, and the first lead and a third lead adjacent to the second lead are separated by a second distance, wherein the second distance extends beyond a zone of potential burr formation from the first lead.

2. The lead frame of claim 1, wherein the plurality of leads are arranged in a single row around the perimeter of the die bond area.

3. The lead frame of claim 1, wherein the plurality of leads comprise a plurality of first leads with the recessed portion from the top surface that form a first row, and a plurality of second leads with a recessed portion from the bottom surface that form a second row.

4. A semiconductor package device, comprising:
   a semiconductor die;
   a lead frame for supporting the semiconductor die; and
   a semiconductor package body at least partially encapsulating the semiconductor die;
   the lead frame comprising:
   a die bond area for receiving the semiconductor die;
   a plurality of leads arranged around and spaced apart from the die bond area for being electrically interconnected with the semiconductor die and for providing electrical interconnection for the semiconductor package device, the leads having a top surface and a bottom surface, wherein a first lead in the plurality of leads has a recessed portion from the top surface, and a second lead adjacent to the first lead has a recessed portion from the bottom surface for reducing burr formation effects, wherein a surface of the recessed portions of the first and second leads are exposed on a surface of the semiconductor package body,
   wherein the first lead and the second lead are adjacent and are separated by a first distance, and the first lead and a third lead adjacent to the second lead are separated by a second distance, wherein the second distance extends beyond a zone of potential burr formation from the first lead; and
   wherein the semiconductor die has first and second surfaces, the first surface attached on the die bond area of the lead frame and the second surface electrically interconnected with at least one lead of the plurality of leads.

5. The semiconductor package device of claim 4, wherein the plurality of leads of the lead frame are arranged in a single row around the perimeter of the die bond area.

6. The semiconductor package device of claim 4, wherein the plurality of leads of the lead frame comprise a plurality of first leads with a recessed portion from the top surface that form a first row exposed on a surface of the semiconductor package body, and a plurality of second leads with a recessed portion from the bottom surface that form a second row exposed on a surface of the semiconductor package body.

7. A method of forming a lead frame for a semiconductor package device, comprising:
   providing a lead frame having a die bond area for receiving a semiconductor die and a plurality of leads arranged around and spaced apart from the die bond area for being electrically interconnected with the semiconductor die and for providing electrical interconnection for the semiconductor package device, the leads having a top surface and a bottom surface;
   removing a portion from the top surface of a first lead in the plurality of leads to form a recessed portion; and
   removing a portion from the bottom surface of a second lead that is adjacent to the first lead to form a recessed;
   wherein the first lead and the second lead are adjacent and are separated by a first distance, and the first lead and a third lead adjacent to the second lead are separated by a second distance, wherein the second distance extends beyond a zone of potential burr formation from the first lead.

8. The method of claim 7, further comprising:
attaching a semiconductor die to the die bond area of the lead frame; and
electrically connecting the semiconductor die with a lead of the lead frame, and encapsulating the die and the lead frame, thereby forming a semiconductor package device.

* * * * *